(12) United States Patent
Han et al.

(10) Patent No.: US 11,431,318 B2
(45) Date of Patent: Aug. 30, 2022

(54) ACOUSTIC RESONATOR AND METHOD OF MANUFACTURING THEREOF

(71) Applicant: Samsung Electro-Mechanics Co., Ltd., Suwon-si (KR)

(72) Inventors: Won Han, Suwon-si (KR); Chang Hyun Lim, Suwon-si (KR); Tae Yoon Kim, Suwon-si (KR); Sang Uk Son, Suwon-si (KR); Sang Kee Yoon, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 691 days.

(21) Appl. No.: 16/391,650

(22) Filed: Apr. 23, 2019

(65) Prior Publication Data

US 2020/0195220 A1  Jun. 18, 2020

(30) Foreign Application Priority Data

Dec. 14, 2018 (KR) .................. 10-2018-0162063
Feb. 8, 2019 (KR) .................. 10-2019-0014686

(51) Int. Cl.
*H03H 9/13* (2006.01)
*H03H 9/17* (2006.01)
(Continued)

(52) U.S. Cl.
CPC ........... *H03H 9/13* (2013.01); *H01L 41/0477* (2013.01); *H03H 3/02* (2013.01); *H03H 9/02031* (2013.01); *H03H 9/176* (2013.01)

(58) Field of Classification Search
CPC ...... H03H 9/13; H03H 9/02031; H03H 9/176; H03H 9/173; H01L 41/0477
See application file for complete search history.

(56) References Cited

U.S. PATENT DOCUMENTS 8,902,023 B2   12/2014  Choy et al.
2006/0131731 A1*  6/2006  Sato .................. H03H 9/105
                                                       257/710
(Continued)

FOREIGN PATENT DOCUMENTS

KR   10-2004-0089914 A   10/2004
KR   10-2014-0033909 A    3/2014
(Continued)

OTHER PUBLICATIONS

Taiwanese Office Action dated Sep. 4, 2020 issued in counterpart to Taiwanese Patent Application No. 108139641 (4 pages in English, 4 pages in Mandarin Chinese).

(Continued)

*Primary Examiner* — Bryan P Gordon
(74) *Attorney, Agent, or Firm* — NSIP Law

(57) ABSTRACT

An acoustic resonator includes: a substrate; a resonant portion including a center portion in which a first electrode, a piezoelectric layer, and a second electrode are sequentially stacked on the substrate, and an extension portion disposed along a periphery of the center portion; and a first metal layer disposed outwardly of the resonant portion to be electrically connected to the first electrode. The extension portion includes a lower insertion layer disposed on an upper surface of the first electrode or a lower surface of the first electrode. The piezoelectric layer includes a piezoelectric portion disposed in the center portion, and a bent portion disposed in the extension portion and extended from the piezoelectric portion at an incline according to a shape of the lower insertion layer. The lower insertion layer is formed of a conductive material extending an electrical path between the first electrode and the first metal layer.

18 Claims, 9 Drawing Sheets

(51) Int. Cl.
*H01L 41/047* (2006.01)
*H03H 3/02* (2006.01)
*H03H 9/02* (2006.01)

(56) References Cited

U.S. PATENT DOCUMENTS

| | | | |
|---|---|---|---|
| 2006/0179642 A1 | 8/2006 | Kawamura | |
| 2007/0057599 A1 | 3/2007 | Motai et al. | |
| 2014/0070671 A1 | 3/2014 | Park et al. | |
| 2016/0163954 A1* | 6/2016 | Shin | H03H 9/173 29/25.35 |
| 2017/0170807 A1* | 6/2017 | Yokoyama | H03H 9/175 |
| 2017/0179923 A1* | 6/2017 | Shin | H03H 9/174 |
| 2017/0373665 A1* | 12/2017 | Lee | H03H 9/173 |
| 2018/0254764 A1* | 9/2018 | Lee | H03H 9/0504 |
| 2018/0262180 A1* | 9/2018 | Lee | H03H 9/173 |
| 2018/0294794 A1* | 10/2018 | Liu | H03H 9/70 |
| 2018/0351534 A1 | 12/2018 | Lee et al. | |

FOREIGN PATENT DOCUMENTS

| | | |
|---|---|---|
| KR | 10-2018-0101129 A | 9/2018 |
| KR | 10-2018-0131313 A | 12/2018 |
| TW | 200620575 A | 11/1994 |
| TW | 200644046 A | 1/1995 |
| TW | 200733438 A | 7/1995 |
| TW | 201824745 A | 7/2018 |
| TW | 201834278 A | 9/2018 |
| WO | WO 2018/063291 A1 | 4/2018 |
| WO | WO 2018/063358 A1 | 4/2018 |

OTHER PUBLICATIONS

Korean Office Action dated Apr. 21, 2020 in the corresponding Korean Patent Application No. 10-2019-0014686 (9 pages in English, 7 pages in Korean).

* cited by examiner

I-I'

US 11,431,318 B2

ACOUSTIC RESONATOR AND METHOD OF MANUFACTURING THEREOF

CROSS-REFERENCE TO RELATED APPLICATIONS

This application claims the benefit under 35 U.S.C. § 119(a) of Korean Patent Applications Nos. 10-2018-0162063 and 10-2019-0014686 filed on Dec. 14, 2018 and Feb. 8, 2019, respectively, in the Korean Intellectual Property Office, the entire disclosures of which are incorporated herein by reference for all purposes.

BACKGROUND

1. Field

The following description relates to an acoustic resonator and a method for manufacturing the same.

2. Description of Related Art

As wireless communication devices are becoming more compact, there is ever-increasing demand for the miniaturization of high-frequency components. As an example, a filter is provided in the form of a bulk acoustic wave (BAW) resonator employing semiconductor thin-film wafer manufacturing technology.

A bulk acoustic wave (BAW) resonator is a filter implemented using a thin-film device causing resonance using piezoelectric characteristics obtained through a piezoelectric dielectric material being deposited on a silicon wafer, which is a semiconductor substrate.

Examples of applications of a bulk acoustic wave (BAW) resonator include mobile communications devices, compact lightweight filters for chemical and biological devices, oscillators, resonant elements, acoustic resonant mass sensors, and the like.

Various structural shapes and functions are being researched, in order to enhance the characteristics and performance of bulk acoustic wave resonators. Accordingly, manufacturing methods of bulk acoustic wave resonators are also being continuously researched.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator includes: a substrate; a resonant portion including a center portion in which a first electrode, a piezoelectric layer, and a second electrode are sequentially stacked on the substrate, and an extension portion disposed along a periphery of the center portion; and a first metal layer disposed outwardly of the resonant portion to be electrically connected to the first electrode. The extension portion includes a lower insertion layer disposed on an upper surface of the first electrode or a lower surface of the first electrode. The piezoelectric layer includes a piezoelectric portion disposed in the center portion, and a bent portion disposed in the extension portion and extended from the piezoelectric portion at an incline according to a shape of the lower insertion layer. The lower insertion layer is formed of a conductive material extending an electrical path between the first electrode and the first metal layer.

The acoustic resonator may further include: a second metal layer disposed outwardly of the resonant portion to be electrically connected to the second electrode; and an upper insertion layer disposed in the extension portion and disposed on an upper surface or a lower surface of the second electrode, and extending an electrical path between the second electrode and the second metal layer.

The second electrode may be spaced apart from the second metal layer, and may be electrically connected to the second metal layer through the upper insertion layer.

The acoustic resonator may further include: a third electrode disposed on a same plane as the first electrode and spaced apart from the first electrode. The second electrode may be electrically connected to the third electrode through the second metal layer.

The upper insertion layer may be spaced apart from a boundary between the center portion and the extension portion. The extension portion may further include a first reflective region disposed between the boundary and the upper insertion layer, and a second reflective region disposed outwardly of the first reflective region. The upper insertion layer and the second electrode may be disposed together in the second reflective region.

The lower insertion layer may be formed of a material with an acoustic impedance lower than an acoustic impedance of the piezoelectric layer and the first electrode.

The piezoelectric layer may be formed of aluminum nitride (AlN). The first electrode may be formed of molybdenum (Mo). The lower insertion layer may be formed of aluminum (Al) or an aluminum (Al) alloy.

The lower insertion layer may be spaced apart from a boundary of the center portion. The extension portion may further include a first reflective region disposed between the boundary and the lower insertion layer, and a second reflective region disposed outwardly of the first reflective region. The lower insertion layer and the second electrode may be disposed together in the second reflective region.

The second reflective region may have an acoustic impedance lower than an acoustic impedance of the first reflective region.

The acoustic resonator may further include: an insulating insertion layer disposed between the lower insertion layer and the piezoelectric layer, and causing the bent portion to rise.

A thickness of the extension portion may be greater than a thickness of the center portion.

In another general aspect, an acoustic resonator includes: a substrate; a resonant portion including a center portion in which a first electrode, a piezoelectric layer, and a second electrode are sequentially stacked on the substrate, and an extension portion disposed along a periphery of the center portion; and a lower insertion layer disposed in the extension portion, and disposed on an upper surface of the first electrode or a lower surface of the first electrode. The lower insertion layer is spaced apart from a boundary between the center portion and the extension portion. The extension portion includes a first reflective region disposed between the boundary and the lower insertion layer, and a second reflective region in which the lower insertion layer and the second electrode are disposed together.

The piezoelectric layer may include a piezoelectric portion disposed in the center portion, and an inclined portion disposed in the extension portion and extended from the piezoelectric portion at an incline according to a shape of the lower insertion layer. The first reflective region and the second reflective region may be disposed within a range in which the inclined portion is disposed.

The lower insertion layer may be formed of a conductive material.

An inclination angle of the inclined portion may be in a range of 5° to 70°.

In another general aspect, a method of manufacturing an acoustic resonator includes: forming a resonant portion by stacking a first electrode, a piezoelectric layer, and a second electrode on a substrate, and forming a lower insertion layer, including a conductive material, on an upper surface of the first electrode or a lower surface of the first electrode; and forming a first metal layer on the lower insertion layer, after the forming of the resonant portion.

The resonant portion may include a center portion in which the first electrode, the piezoelectric layer, and the second electrode are sequentially stacked on the substrate, and an extension portion disposed along a periphery of the center portion. The lower insertion layer may be disposed in the extension portion and spaced apart from a boundary between the center portion and the extension portion by a distance.

The extension portion may include a first reflective region disposed between the boundary and the lower insertion layer, and a second reflective region disposed outwardly of the first reflective region, and in which the lower insertion layer and the second electrode are disposed together.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
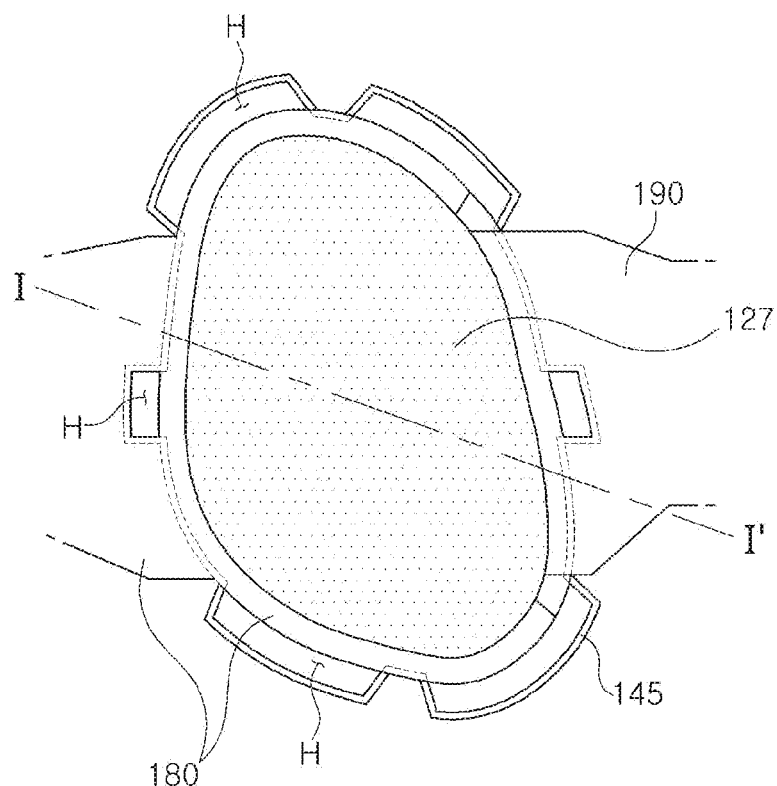
FIG. 1 is a plan view of an acoustic resonator, according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
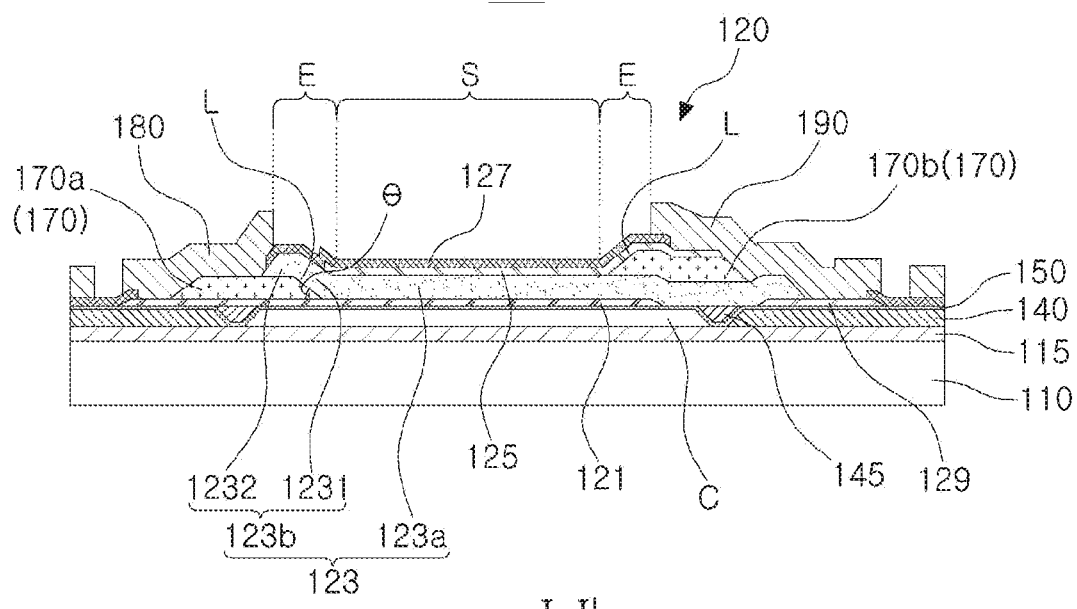
FIG. 2 is a cross-sectional view taken along line I-I' of FIG. 1.

FIG. 1 is a plan view illustrating an acoustic resonator 100, according to an example. FIG. 2 is a cross-sectional view taken along line I-I' of FIG. 1.

Referring to FIGS. 1 and 2, the acoustic resonator 100 according to an example may be a bulk acoustic wave (BAW) resonator, and may include a substrate 110, a sacrificial layer 140, a resonant portion 120, and an insertion layer 170.

The substrate 110 may be a silicon substrate. For example, the substrate 110 may be a silicon wafer or a silicon-on-insulator (SOI) substrate.

An insulating layer 115 may be provided on an upper surface of the substrate 110 to electrically isolate the substrate 110 and the resonant portion 120 from each other. Moreover, the insulating layer 115 may prevent the substrate 110 from being etched by an etching gas, when a cavity C is formed during a method of manufacturing the acoustic resonator 100.

In this example, the insulating layer 115 may be formed of any one or any combination of any two or more of silicon dioxide ($SiO_2$), silicon nitride ($Si_3N_4$), aluminum oxide ($Al_2O_3$), and aluminum nitride (AlN), and may be formed on the substrate 110 through a process such as chemical vapor deposition, RF magnetron sputtering, or evaporation.

The sacrificial layer 140 is formed on the insulating layer 115, and the cavity C and the etch-stop portion 145 may be disposed in the sacrificial layer 140.

The cavity C is formed as an empty space, and may be formed by removing a portion of the sacrificial layer 140.

Since the cavity C is formed in the sacrificial layer 140, the entirety of the resonant portion 120, formed above the sacrificial layer 140, may be formed to be flat.

The etch-stop portion 145 is disposed along a boundary of the cavity C. The etch-stop portion 145 is provided to prevent etching from continuing into a cavity region during formation of the cavity C. Thus, a horizontal area of the cavity C is defined by the etch-stop portion 145, and the vertical area (for example, a height) is defined by a thickness of the sacrificial layer 140.

The membrane layer 150 is formed on the sacrificial layer 140 and forms an upper surface of the cavity C. Thus, the membrane layer 150 is also formed of a material that is not easily removed during a process for forming the cavity C.

For example, when a halide-based etching gas such as fluorine (F), chlorine (Cl), or the like, is used to remove a portion of the sacrificial layer 140 (for example, a cavity region), the membrane layer 150 may be formed of a material having low reactivity with the etching gas. In this case, the membrane layer 150 may include either one or both of silicon dioxide ($SiO_2$) and silicon nitride ($Si_3N_4$).

Moreover, the membrane layer 150 may include a dielectric layer including at any one or any combination of any two or more of magnesium oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or may include a metal layer including any one or any combination of any two or more of aluminum (Al), nickel (Ni), chrome (Cr), platinum (Pt), gallium (Ga), and hafnium (Hf). The configuration of the membrane layer is not, however, limited to the aforementioned examples.

A seed layer (not shown), which may be formed of aluminum nitride (AlN), may be formed on the membrane layer 150. In detail, the seed layer may be disposed between the membrane layer 150 and the first electrode 121. The seed layer may be formed using a dielectric or a metal having a hexagonally closed packed (HCP) structure, in addition to AlN. In an example in which the seed layer is formed using a metal, the seed layer may be formed of titanium (Ti), for example.

The resonant portion 120 includes a first electrode 121, a piezoelectric layer 123, and a second electrode 125. In the resonant portion 120, the first electrode 121, the piezoelectric layer 123, and the second electrode 125 are stacked from bottom to top. Thus, in the resonant portion 120, the piezoelectric layer 123 is disposed between the first electrode 121 and the second electrode 125.

The resonant portion 120 is formed on the membrane layer 150. As a result, the membrane layer 150, the first electrode 121, the piezoelectric layer 123, and the second electrode 125 are sequentially stacked on the substrate 110 to form the resonant portion 120.

The resonant portion 120 may resonate the piezoelectric layer 123 according to a signal, applied to the first electrode 121 and the second electrode 125, to generate a resonance frequency and an antiresonance frequency.

The resonant portion 120 may include a center portion S, in which the first electrode 121, the piezoelectric layer 123, and the second electrode 125 are sequentially stacked, and an extension portion E with the insertion layer 170 interposed therebetween.

The center portion S is a region disposed in the center of the resonant portion 120, and the extension portion E is a region disposed along a periphery of the center portion S. Accordingly, the extension portion E refers to a region extended outwardly from the center portion S.

The insertion layer 170 has an inclined surface L of which a thickness becomes greater as a distance from the center portion S increases. In the extension portion E, portions of the piezoelectric layer 123 and the second electrode 125 are disposed on the insertion layer 170. Thus, in the extension portion E, the piezoelectric layer 123 and the second electrode 125 have an inclined surface formed according to a shape of the inclined surface L of the insertion layer 170.

In the example of FIGS. 1 and 2, the extension portion E is included in the resonant portion 120, and thus resonance may occur even in the extension portion E. However, the disclosure is not limited to this example, and resonance may not occur in the extension portion E, but may occur in the center portion S, depending on a structure of the extension portion E.

The first electrode 121 and the second electrode 125 may be formed of a conductor, for example, gold, molybdenum, ruthenium, iridium, aluminum, platinum, titanium, tungsten, palladium, tantalum, chromium, nickel, or a metal containing any one or any combination of any two or more of gold, molybdenum, ruthenium, iridium, aluminum, platinum, titanium, tungsten, palladium, tantalum, chromium, and nickel.

However, the first and second electrodes 121 and 124 are not limited to the foregoing materials.

The first electrode 121 has an area wider than that of the second electrode 125 in the resonant portion 120, and a first metal layer 180 is disposed on the first electrode 121 along an outer edge of the first electrode 121. Thus, the first metal layer 180 is spaced apart from the second electrode 125 by a predetermined distance, and may be disposed to surround the resonant portion 120.

Since the first electrode 121 is disposed on the membrane layer 150, the first electrode is entirely flat. On the other hand, since the second electrode 125 is disposed on the piezoelectric layer 123 and the upper insertion layer 170b, the second electrode may have a bent portion corresponding to a shape of the piezoelectric layer 123 and the upper insertion layer 170b in the extension portion E.

The second electrode 125 is disposed throughout the entire center portion S, and partially disposed in the extension portion E. Thus, the second electrode 125 may include a portion disposed on the piezoelectric portion 123a of the piezoelectric layer 123, to be described later, a portion disposed on the bent portion 123b of the piezoelectric layer 123 in the extension portion E, and a portion disposed on the upper insertion layer 170b, to be described later, in the extension portion E.

In addition, the portion disposed on an inclined portion 1231 of the piezoelectric layer 123, may be formed to have an area smaller than that of an inclined surface of the inclined portion 1231.

The piezoelectric layer 123 is formed on the first electrode 121, and the lower insertion layer 170a, to be described later.

In the example of FIGS. 1 and 2, the piezoelectric layer 123 may be formed of aluminum nitride (AlN). However, the piezoelectric layer is not limited to being formed of AlN, and zinc oxide (ZnO), doped aluminum nitride, lead zirconate titanate, and quartz may be selectively used as a material of the piezoelectric layer 123. In an example in which the piezoelectric layer is formed of doped aluminum nitride, a rare earth metal, a transition metal, or an alkaline earth metal may further be included. For example, the rare earth metal may include any one or any combination of any two or more of scandium (Sc), erbium (Er), yttrium (Y), and lanthanum (La). The transition metal may include any one or any combination of any two or more of hafnium (Hf), titanium (Ti), zirconium (Zr), tantalum (Ta), and niobium (Nb). Moreover, the alkaline earth metal may include magnesium (Mg).

The piezoelectric layer 123 according may include a piezoelectric portion 123a disposed in the center portion S, and a bent portion 123b disposed in the extension portion E.

The piezoelectric portion 123a is a portion directly stacked on an upper surface of the first electrode 121. Thus, the piezoelectric portion 123a is interposed between the first electrode 121 and the second electrode 125, disposed flat with the first electrode 121 and the second electrode 125.

The bent portion 123b may be defined as a region, which rises due to a lower insertion layer 170a, to be described later, of a region extended outwardly from the piezoelectric portion 123a and located within the extension portion E.

Thus, the bent portion 123b is disposed on the lower insertion layer 170a, to be described later, and may be formed to have a shape curved according to a shape of the lower insertion layer 170a. Thus, the piezoelectric layer 123 is curved at a boundary between the piezoelectric portion 123a and the bent portion 123b, and the bent portion 123b rises to correspond to a thickness and a shape, of the lower insertion layer 170a.

The bent portion 123b may include the inclined portion 1231 and an extended portion 1232.

The inclined portion 1231 is a portion formed to be inclined due to the inclined surface L of the lower insertion layer 170a, to be described later. Moreover, the extended portion 1232 is a portion extended outwardly from the inclined portion 1231.

An upper surface of the inclined portion 1231 may be formed to be level with the inclined surface L of the lower insertion layer 170a, and thus an inclination angle of the inclined portion 1231 may be equal to an inclination angle θ of the inclined surface L of the lower insertion layer 170a.

The insertion layer 170 is disposed around the center portion S and disposed below the second electrode 125.

Thus, the insertion layer 170 is disposed in the entirety of a region, excluding the center portion S, or in some regions.

The insertion layer 170 is formed of a metal material, and may include a lower insertion layer 170a and an upper insertion layer 170b, spaced apart from each other. Thus, in the following description, references to the insertion layer 170 include both the lower insertion layer 170a and the upper insertion layer 170b.

In the present example, the entirety of the lower insertion layer 170a is disposed on the first electrode 121. However, the disclosure is not limited to such a configuration, and the lower insertion layer 170a may be extended outwardly of the first electrode 121, if necessary. In such an example, the lower insertion layer 170a may be disposed on a surface of the membrane layer 150 and the etch-stop portion 145.

The lower insertion layer 170a is disposed in a region, in which the upper insertion layer 170b is not is disposed, of a circumference of the center portion S, to support the bent portion 123b of the piezoelectric layer 123. Thus, at least a portion of the lower insertion layer 170a is disposed between the piezoelectric layer 123 and the first electrode 121.

The bent portion 123b of the piezoelectric layer 123 may include an inclined portion 1231 and an extended portion 1232, according to a shape of the lower insertion layer 170a.

Moreover, the lower insertion layer 170a is disposed between the first electrode 121 and the first metal layer 180. Thus, the lower insertion layer 170a allows an electrical path between the first electrode 121 and the first metal layer 180 to be extended in a portion of the extension portion E. This configuration may lower wiring resistance of the first electrode 121 in the extension portion E or in the vicinity thereof. Thus, insertion loss of an acoustic resonator may be reduced.

The upper insertion layer 170b is disposed between the second electrode 125 and the piezoelectric layer 123, and may be disposed to be in contact with the portion of the second electrode 125 disposed in the extension portion E.

In the illustrated example, the upper insertion layer 170b is formed on the piezoelectric layer 123, and the second electrode 125 is stacked and disposed on an upper surface of the upper insertion layer 170b. However, the disclosure is not limited to this configuration, and the upper insertion layer 170b may be stacked and disposed between the second electrode 125 and the protective layer 127, if necessary.

Moreover, one side of the upper insertion layer 170b is connected to the second metal layer 190. Thus, the upper insertion layer 170b allows an electrical path between the second electrode 125 and the second metal layer 190 to be extended in a portion of the extension portion E. This configuration may lower wiring resistance of the second electrode 125 in the extension portion E or in the vicinity thereof. Thus, insertion loss of the acoustic resonator 100 may be reduced.

The insertion layer 170, configured as described above, is formed to have a thickness which becomes greater as a distance from the center portion S increases. Thus, the insertion layer 170 has a side surface, disposed to be adjacent to the center portion S, as an inclined surface L having a constant inclination angle α.

In order to manufacture a configuration in which the inclination angle θ of the side surface of the insertion layer 170 is formed to be less than 5°, a thickness of the insertion layer 170 is required to be significantly small, or an area of the inclined surface L is required to be significantly large. Hence, there is difficulty in in implementing the insertion layer 170 to have an inclination angle θ that is less than 5°.

Moreover, if the inclination angle θ of a side surface of the insertion layer 170 is formed to be greater than 70°, an inclination angle of the piezoelectric layer 123 or the second electrode 125, stacked on the insertion layer 170, is also formed to be greater than 70°. In this case, the piezoelectric layer 123 or the second electrode 125, stacked on the inclined surface L, is excessively bent, and thus cracking may occur in a bent portion.

Thus, in the example of FIGS. 1 and 2, the inclination angle θ of the inclined surface L is formed in a range of greater than or equal to 5° to less than or equal to 70°.

In the example of FIGS. 1 and 2, the inclined portion 1231 of the piezoelectric layer 123 is formed along the inclined surface L of the insertion layer 170, and is thus formed to have an inclination angle equal to that of the inclined surface L of the insertion layer 170. Thus, the inclination angle of the inclined portion 1231 is formed in a range of greater than or equal to 5° or more to less than or equal to 70°, in a manner similar to the inclined surface L of the insertion layer 170. This configuration is also applied to the second electrode 125 stacked on the inclined surface L of the insertion layer 170.

Moreover, the inclination angle of the lower insertion layer 170a and the inclination angle of the upper insertion layer 170b may be different from each other. However, the inclination angles are formed to be included in the above-mentioned range.

The lower insertion layer 170a is formed of a material having acoustic impedance lower than that of other components disposed adjacent thereto. In detail, the lower insertion layer 170a is formed of a material with acoustic impedance lower than that of the piezoelectric layer 123, and the first and second electrodes 121 and 125.

For example, in the acoustic resonator according to the present example, in order to implement a resonant frequency of 4.9 GHz, the second electrode 125 is formed of molybdenum (Mo), of which a thickness is 1000 Å, the piezoelectric layer 123 is formed of aluminum nitride (AlN), of which a thickness is 4000 Å, and the first electrode 121 is formed of molybdenum (Mo), of which a thickness is 1200 Å.

In this example, the lower insertion layer 170a of a metal material bonded to the first electrode 121 is required to be formed of a material in which resistance is low, and acoustic impedance is lower than that of a material of the piezoelectric layer 123 or a material of the first electrode 121. Advantageously, a material may be aluminum (Al) or an aluminum (Al)-based material, and a thickness may be configured to be in a range of about 1000 Å to about 6000 Å. The disclosure is not, however, limited to this example.

The upper insertion layer 170b may be formed of a material that is the same as that of the first lower insertion layer 170 layer 170a. Moreover, the upper insertion layer 170 may be able to be formed of molybdenum (Mo), ruthenium (Ru), gold (Au), platinum (Pt), or the like, with low electrical resistance. A thickness of the upper insertion layer 170b may be formed in a range of about 1000 Å to about 6000 Å, in a manner similar that of the lower insertion layer 170a.

The resonant portion 120 is spaced apart from the substrate 110 through the cavity C, which is an empty space.

The cavity C may be formed by removing a portion of the sacrificial layer 140 by supplying an etching gas (or an etching solution) to an inlet hole (H of FIG. 1) during a process for manufacturing the acoustic resonator 100.

The protective layer 127 is disposed along a surface of the acoustic resonator 100 to protect the acoustic resonator 100 from an external factor. The protective layer 127 may be disposed along a surface formed by the second electrode 125 and the bent portion 123b of the piezoelectric layer 123.

The protective layer 127 may be formed of an insulating material including any one or any combination of any two or more of a silicon-oxide-based material, silicon-nitride-based material, an aluminum-oxide-based material, and an aluminum-nitride-based material, but is not limited thereto.

The protective layer 127 may include a single layer. Alternatively, two layers formed of different materials may be stacked to form the protective layer 127, if necessary.

The first electrode 121 and the second electrode 125 may be extended outwardly of the resonant portion 120. Moreover, the first metal layer 180 and the second metal layer 190 may be disposed on upper surfaces of extended portions of the first electrode 121 and the second electrode 125, respectively, as described above.

The first metal layer 180 and the second metal layer 190 may be formed of a material such as gold (Au), a gold-tin (Au—Sn) alloy, copper (Cu), a copper-tin (Cu—Sn) alloy, or the like.

The first metal layer 180 and the second metal layer 190 may function as a connection wiring electrically connecting the electrodes 121 and 125 to an electrode of another acoustic resonator disposed adjacent thereto on the substrate 110. Alternatively, the first metal layer 180 and the second metal layer 190 may function as a terminal for external connection. The present disclosure is not, however, limited to the foregoing example. Referring to FIG. 2, the second metal layer 190 may allow the second electrode 125, which is disposed on the upper insertion layer 170b, and a third electrode 129, which is disposed below the piezoelectric layer 123, to be connected to each other. The third electrode 129 is an electrode manufactured together with the first electrode 125, and may be formed of a material that is the same as that of the first electrode 125 and may be disposed on the same plane as the first electrode 125. The third electrode 129 may be connected to a first electrode or a second electrode of another acoustic resonator (not shown) disposed adjacent thereto on the substrate 110.

The first metal layer 180 passes through the protective layer 127 to be bonded to the first electrode 121.

Moreover, the first electrode 121 has an area wider than that of the second electrode 125 in the resonant portion 120, and a first metal layer 180 is formed in a peripheral portion of the first electrode 121.

Thus, the first metal layer 180 is disposed along a periphery of the resonant portion 120, and is disposed to surround the second electrode 125. The present disclosure is not, however, limited to such a configuration.

The extension portion E of the resonant portion 120 is formed to have a thickness greater than that of the center portion S, due to the insertion layer 170. Thus, vibrations, generated in the center portion S, are suppressed from flowing to an outer edge, thereby increasing a Q-factor of the acoustic resonator 100.

Moreover, the second electrode 125 is partially disposed in the extension portion E, thereby providing remarkably improved resonance performance.

Moreover, the insertion layer 170 is formed of a metal material (or a conductive material) and is disposed in a boundary portion of the center portion S (that is, an active area) of the acoustic resonator 100. Thus, in the boundary portion of the center portion S, an electrical path of the first electrode 121 or the second electrode 125 is extended. In this regard, wiring resistance of the first electrode 121 and the second electrode 125 is lowered, thereby reducing insertion loss of the acoustic resonator 100.

Furthermore, as compared to an acoustic resonator according to the related art in which an insertion layer 170 is formed of an insulating material, in the case of the insertion layer 170 being formed of a metal material as in the example of FIGS. 1 and 2, a change in temperature with maximum power applied to the acoustic resonator 100 was measured as 13.4%, which is smaller. In this regard, it was confirmed that heat dissipation characteristics were relatively excellent.

Next, a method of manufacturing the acoustic resonator 100 will be described.

FIGS. 3 to 6 are views illustrating a method of manufacturing the acoustic resonator 100, according to an example.

Figure 3:
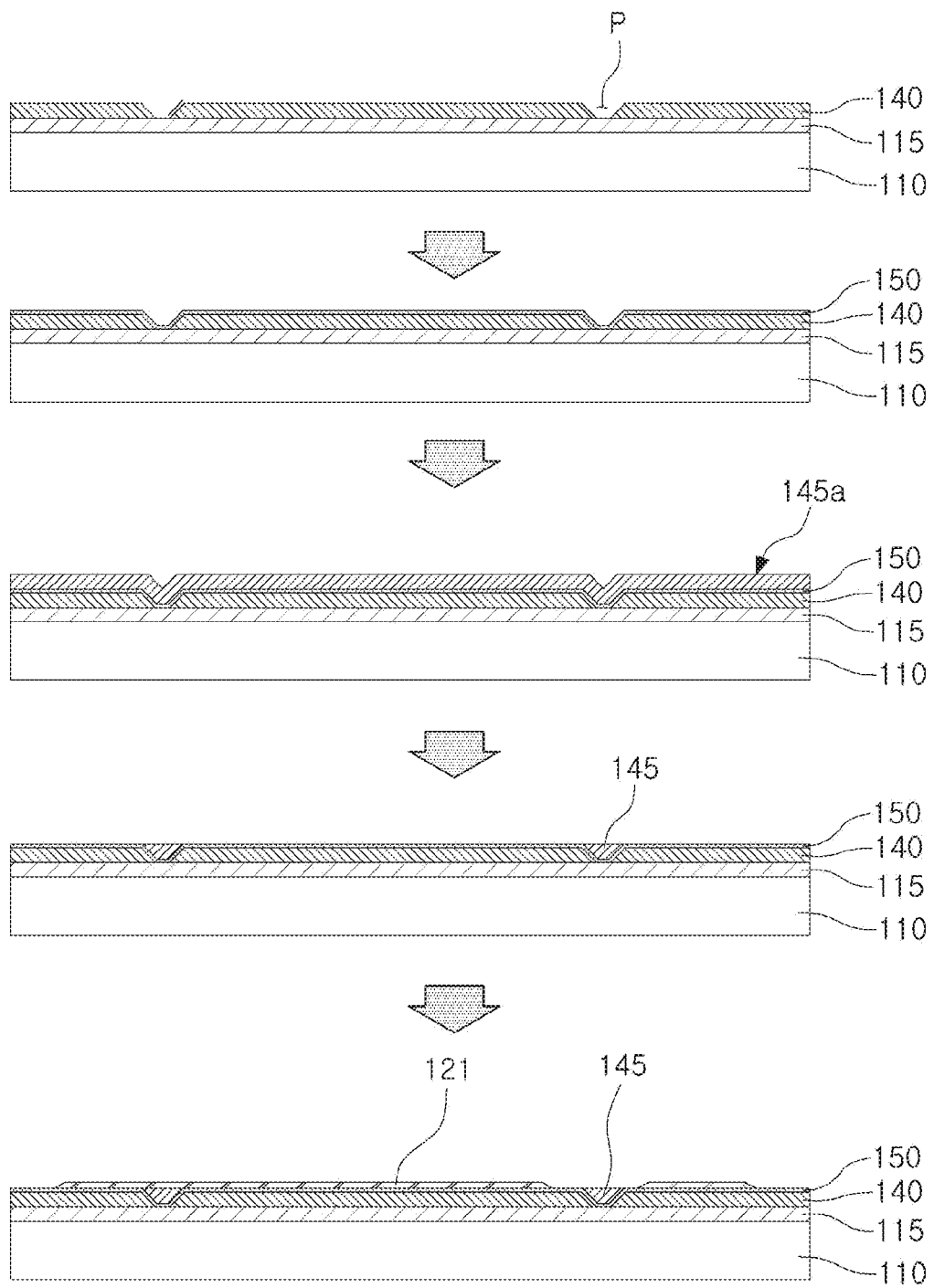
FIGS. 3 to 6 are views illustrating a method of manufacturing an acoustic resonator, according to an example.

First, referring to FIG. 3, in the method of manufacturing the acoustic resonator 100, the insulating layer 115 and the sacrificial layer 140 are formed on a substrate 110 first, and then a pattern P passing through the sacrificial layer 140 is provided. Thus, the insulating layer 115 is exposed externally through the pattern P.

The insulating layer 115 may be formed of magnesium oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), zinc oxide (ZnO), silicon nitride (SiN), or silicon oxide ($SiO_2$), or the like, but is not limited thereto.

The pattern P, formed in the sacrificial layer 140, is formed to have a side surface, which is inclined. In this regard, an abrupt step being generated at a boundary between the etch-stop portion 145, which will be formed later in the pattern P, and the sacrificial layer 140 may be prevented. Moreover, the pattern P may be formed to have a cross section in the form of a trapezoid, in which a width of an upper surface is wider than a width of a lower surface. In this regard, dishing may be prevented from occurring. For example, an angle formed by a lower surface and a side surface of a cross section of the pattern P may be 110° to 160°, and a width of a lower surface may be 2 μm to 30 μm.

A portion of the sacrificial layer 140 is removed through a subsequent etching process to form the cavity C (FIG. 2). Thus, the sacrificial layer 140 may be formed of a material that can be easily etched, such as polysilicon or polymer. The disclosure is not, however, limited to such an example.

Then, the membrane layer 150 is formed on the sacrificial layer 140. The membrane layer 150 is formed to have a constant thickness along a surface of the sacrificial layer 140. The thickness of the membrane layer 150 may be less than a thickness of the sacrificial layer 140.

The membrane layer 150 may include either one or both of silicon dioxide ($SiO_2$) and silicon nitride ($Si_3N_4$). Moreover, the membrane layer 150 may include a dielectric layer including any one or any combination of any two or more of magnesium oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or a metal layer including any one or combination of any two or more of aluminum (Al), nickel (Ni), chrome (Cr), platinum (Pt), gallium (Ga), and hafnium (Hf). The membrane layer 150 is not, however, limited to the example configurations.

Although not illustrated, a seed layer may be formed on the membrane layer 150. The seed layer may be disposed between the membrane layer 150 and the first electrode 121, which will be described later. The seed layer may be formed of aluminum nitride (AlN), but is not limited thereto. Alternatively, the seed layer may be formed using a dielectric or metal having an HCP structure. For example, when the seed layer is formed of the metal, the seed layer may be formed of titanium (Ti).

Then, an etch-stop layer 145a is formed on the membrane layer 150. The etch-stop layer 145a is filled in an interior of the pattern P.

The etch-stop layer 145a is formed to have a thickness completely filling the pattern P. Thus, the etch-stop layer 145a may be formed to be thicker than the sacrificial layer 140.

The etch-stop layer 145a may be formed of a material that is the same as that of the insulating layer 115, but is not limited thereto.

Then, the etch-stop layer 145a is removed to expose the membrane layer 150 externally.

In this example, a portion of the etch-stop layer filled in the interior of the pattern P remains, and the remaining portion of the etch-stop layer 145a may serve as the etch-stop portion 145.

Figure 4:
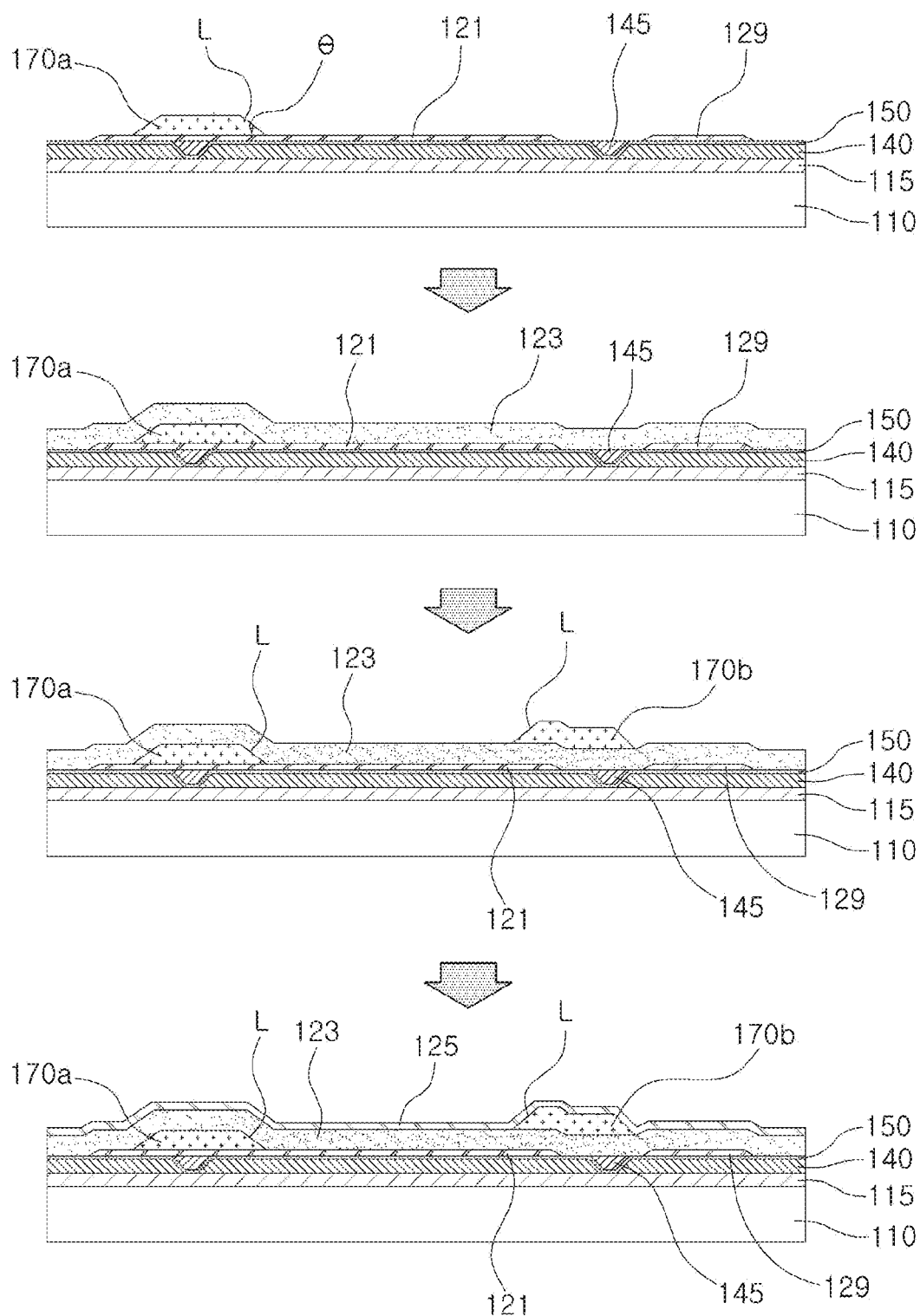

Next, as illustrated in FIG. 4, the first electrode 121 and the third electrode 129 are formed on an upper surface of the membrane layer 150.

The first electrode 121 and the third electrode 129 may be formed of a conductor, for example, gold, molybdenum, ruthenium, iridium, aluminum, platinum, titanium, tungsten, palladium, tantalum, chromium, nickel, or a metal containing any one or any combination of any two or more thereof, but it is not limited thereto.

The first electrode 121 may be formed on an upper portion of a region in which the cavity C (FIG. 2) is to be formed.

The first electrode 121 and the third electrode 129 are formed simultaneously, for example, by removing an unnecessary portion of a conductor layer, after the conductor layer is provided to cover the entirety of the membrane layer 150.

Then, the lower insertion layer 170a is provided. The lower insertion layer 170a is formed on the first electrode 121, and may be extended to an upper portion of the membrane layer 150, if necessary.

The lower insertion layer 170a may be completed through a patterning process for removing an unnecessary portion of a conductive material, after the conductive material is deposited to cover the entirety of a surface formed by the membrane layer 150, the first electrode 121, and the etch-stop portion 145.

Thus, the lower insertion layer 170a is not disposed on the center portion S (FIG. 2). In the example of FIGS. 3-6, the entirety of the lower insertion layer 170a is disposed on the first electrode 121. The disclosure is not, however, limited to the example configuration of the lower insertion layer 170a. When a shape of the first electrode 121 is changed, at least a portion of the lower insertion layer 170a may be stacked on the membrane layer 150 or the etch-stop portion 145.

A side surface of the lower insertion layer 170a disposed adjacent to the center portion S is formed as an inclined surface L (FIG. 2). The lower insertion layer 170a has the inclined surface L, of which a thickness is reduced toward the center portion S, and thus a lower surface of the lower insertion layer 170a is further extended toward the center portion S as compared with an upper surface of the lower insertion layer 170a. An inclination angle of the inclined surface L of the lower insertion layer 170a may be in the range of 5° to 70°, as described previously.

The lower insertion layer 170a is formed of a metal material, and may be formed of a material with acoustic impedance, lower than that of the piezoelectric layer 123 and the first electrode 121. As described above, when the piezoelectric layer 123 is formed of aluminum nitride (AlN), the lower insertion layer 170a may be formed of aluminum or an aluminum alloy material.

Then, the piezoelectric layer 123 is formed on the first electrode 121 and the lower insertion layer 170a. The piezoelectric layer 123 may be formed of aluminum nitride (AlN) but is not limited thereto. Zinc oxide (ZnO), doped aluminum nitride, lead zirconate titanate, quartz, or the like, may be selectively used for the piezoelectric layer 123. When the piezoelectric layer 123 is formed of doped aluminum nitride, a rare earth metal, a transition metal, or an alkaline earth metal may further be included. For example, the rare earth metal may include any one or any combination of any two or more of scandium (Sc), erbium (Er), yttrium (Y), and lanthanum (La). The transition metal may include any one or any combination of any two or more of hafnium (Hf), titanium (Ti), zirconium (Zr), tantalum (Ta), and niobium (Nb). Moreover, the alkaline earth metal may include magnesium (Mg).

The piezoelectric layer 123 may be formed by partially removing an unnecessary portion of a piezoelectric material, after the piezoelectric material is formed in the entirety of a surface formed by the first electrode 121, the lower insertion layer 170a, and the like. In the example of FIGS. 3-6, in a process of forming the second electrode 125, the unnecessary portion of the piezoelectric material is removed together with the second electrode 125 to complete the piezoelectric layer 123. However, alternatively, the piezoelectric layer 123 may be completed by removing an unnecessary portion of a piezoelectric material before the second electrode 125 is formed.

The piezoelectric layer 123 is stacked on the first electrode 121 and the lower insertion layer 170a, and may be formed according to a shape of a surface formed by the first electrode 121 and the lower insertion layer 170a.

As illustrated in FIG. 2, a portion of the piezoelectric layer 123 that is stacked on the first electrode 121 forms the piezoelectric portion 123a, and a portion of the piezoelectric layer 123 that is stacked on the lower insertion layer 170a forms the bent portion 123b.

Then, the upper insertion layer 170b is formed on the piezoelectric layer 123. The upper insertion layer 170b may be formed of a material that is the same as that of the lower insertion layer 170a. In this case, the upper insertion layer 170b may be provided using a formation method, the same as that of the lower insertion layer 170a. The disclosure is not, however, limited to the foregoing configuration.

Then, the second electrode 125 is formed in an upper surface of the piezoelectric layer 123 and the upper insertion layer 170b. The second electrode 125 may be formed of a conductor, for example, gold, molybdenum, ruthenium, iridium, aluminum, platinum, titanium, tungsten, palladium, tantalum, chromium, nickel, or a metal containing any one or any combination of any two or more thereof, but it is not limited thereto.

Figure 5:
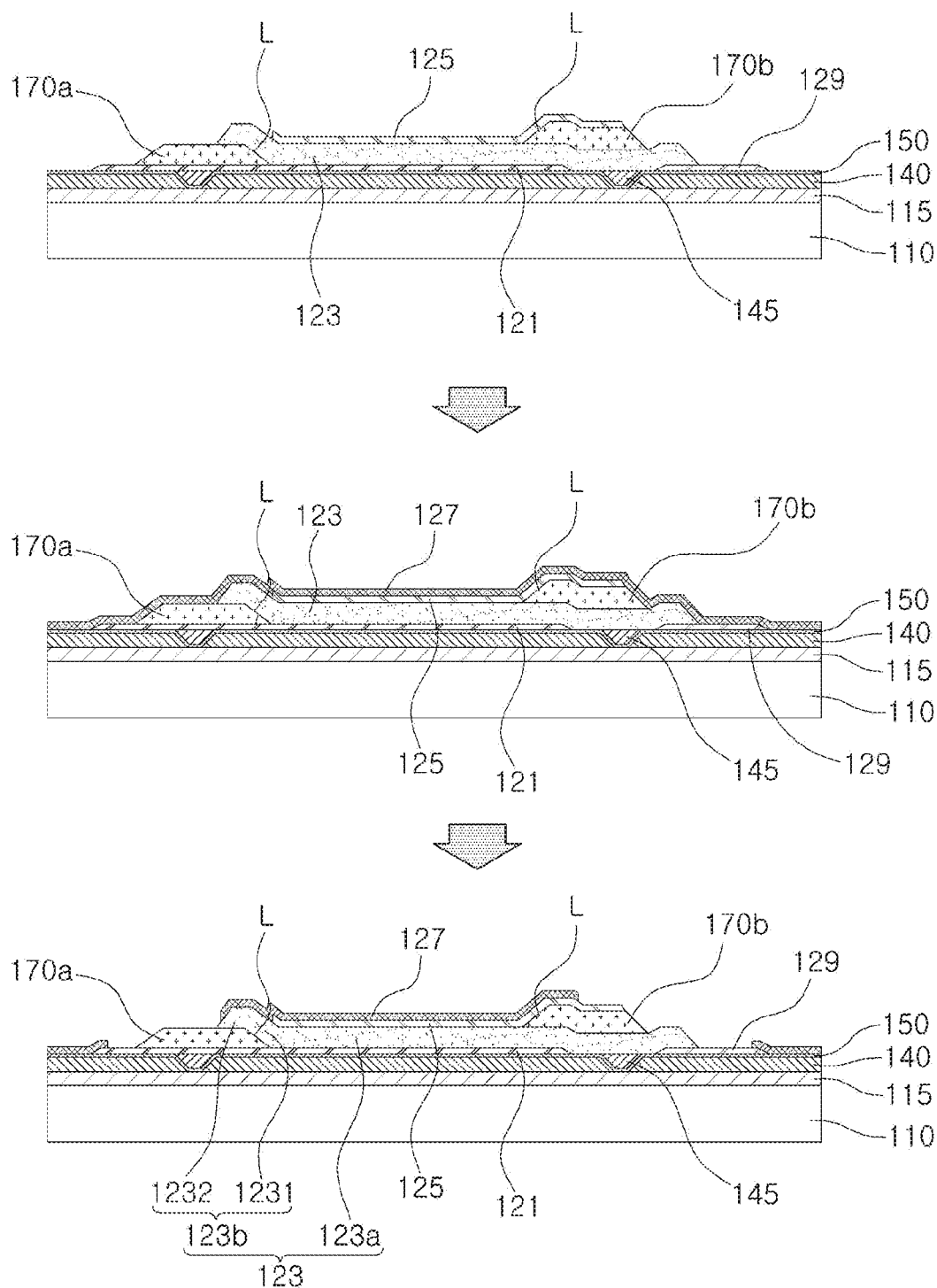

The second electrode 125 may have the form illustrated in FIG. 5, by removing an unnecessary portion of a conductive layer using a method such as etching, or the like, after the conductive layer is formed on the entirety of a surface formed by the piezoelectric layer 123 and the upper insertion layer 170b. During the process described above, a process for removing an unnecessary portion of the piezoelectric layer 123 may be performed.

Then, the protective layer 127 is provided.

The protective layer 127 may be formed along a surface formed by the second electrode 125, the piezoelectric layer 123, and the upper insertion layer 170b.

The protective layer 127 may be formed of an insulating material including any one or any combination of any two or more of a silicon-oxide-based material, a silicon-nitride-based material, an aluminum-oxide-based material, and an aluminum-nitride-based material, but is not limited thereto.

Figure 6:
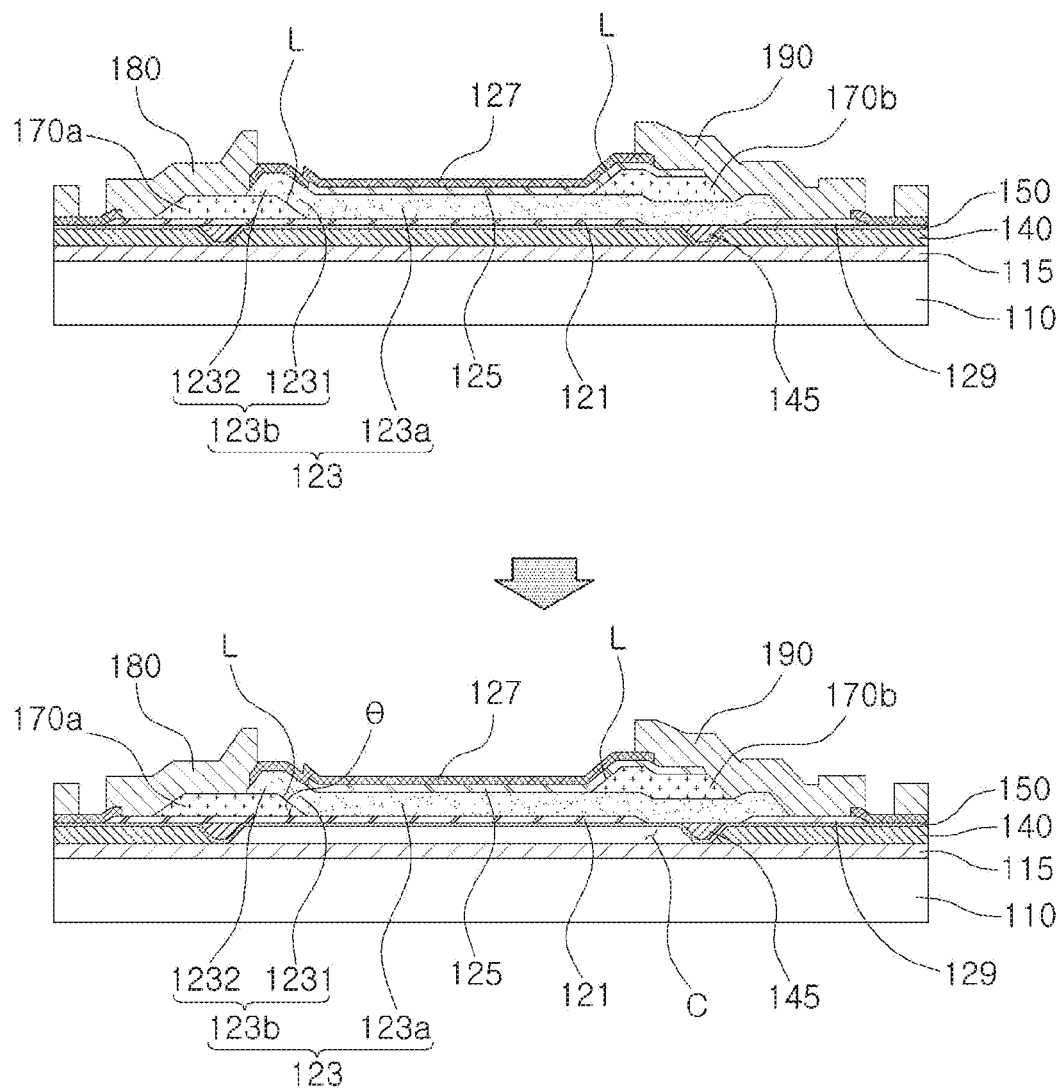

Next, as illustrated in FIGS. 5 and 6, the protective layer 127 is partially removed to partially expose the first electrode 121 and the second electrode 125, and the first metal layer 180 and the second metal layer 190 are formed in exposed portions, respectively, to complete the acoustic resonator 100 illustrated in FIG. 2.

During a process for removing the protective layer 127, not only the first electrode 121 and the second electrode 125, but also the lower insertion layer 170a, the upper insertion layer 170b, and the third electrode 129 are partially exposed. Thus, the first metal layer 180 is formed on the first electrode 121 and the lower insertion layer 170a, and the second metal layer 190 is formed on the second electrode 125, the upper insertion layer 170b, and the third electrode 129, to electrically connect each other.

The first metal layer 180 and the second metal layer 190 may be formed of a material such as gold (Au), a gold-tin (Au—Sn) alloy, copper (Cu), a copper-tin (Cu—Sn) alloy, or the like, and may be formed using a method such as deposition, or the like, but it is not limited thereto.

Then, a cavity C is formed. The cavity C is formed by removing a portion of the sacrificial layer located inside of the etch-stop portion 145, so the acoustic resonator 100, illustrated in FIG. 2, is completed. The portion of the sacrificial layer 140 may be removed by supplying an etching gas (or an etching solution) to an inlet hole H (FIG. 1).

When the sacrificial layer 140 is formed of a material such as polysilicon or polymer, the sacrificial layer 140 may be removed through a dry etching method using a halide-based etching gas (for example, xenon difluoride ($XeF_2$)), such as fluorine (F), chlorine (Cl), or the like.

The disclosure is not limited to the above-mentioned examples, and may be modified in various ways.

Figure 7:
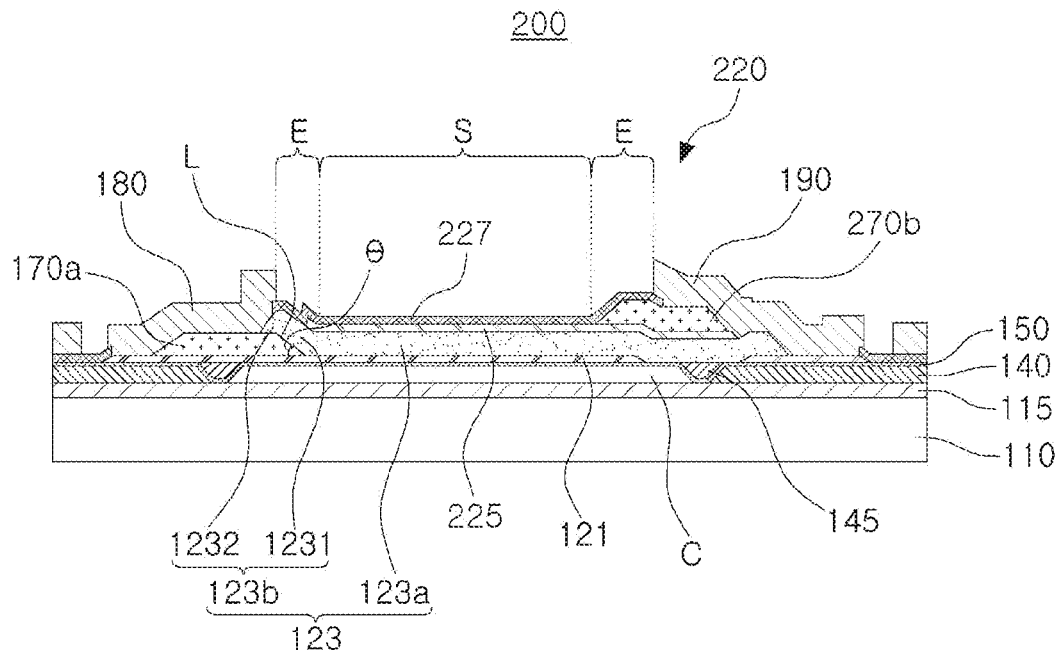
FIG. 7 is a schematic cross-sectional view illustrating an acoustic resonator, according to another example.

FIG. 7 is a schematic cross-sectional view illustrating an acoustic resonator 200 including a resonant portion 220, according to another example.

Referring to FIG. 7, in the acoustic resonator 200, an upper insertion layer 270b is disposed between a second electrode 225 and a protective layer 227. In further detail, the upper insertion layer 270b is formed on an upper surface of the second electrode 225, and the protective layer 227 is formed on an upper surface of the upper insertion layer 270b.

The acoustic resonator 200 may be manufactured by stacking the upper insertion layer 270b on the second electrode 225 after the second electrode 225 is completed.

Figure 8:
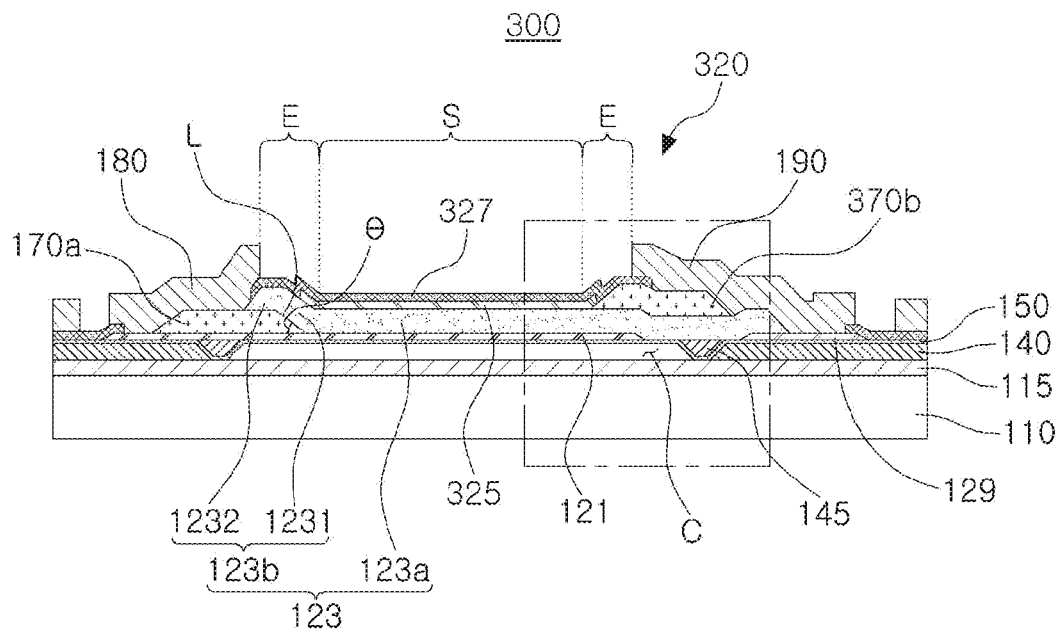
FIG. 8 is a schematic cross-sectional view illustrating an acoustic resonator, according to another example.
Figure 9:
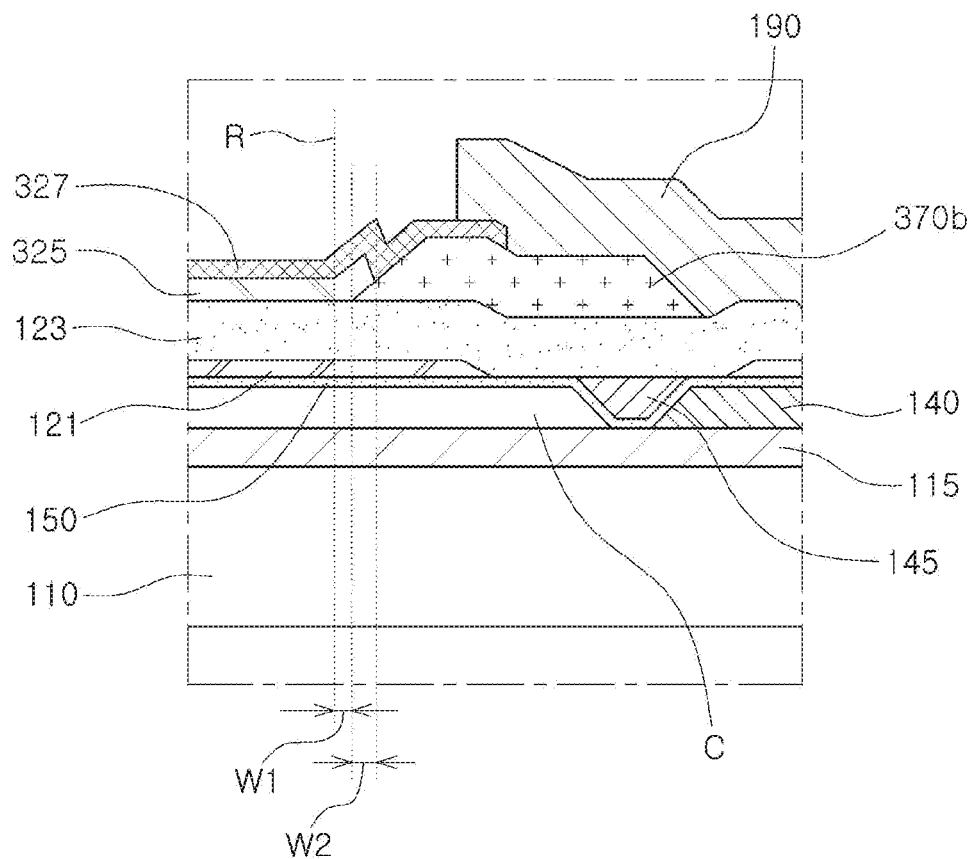
FIG. 9 is an enlarged view of an upper insertion layer of FIG. 8.

FIG. 8 is a schematic cross-sectional view illustrating an acoustic resonator 300, according to another example. FIG. 9 is an enlarged view of an upper insertion layer 370b of FIG. 8.

Referring to FIGS. 8 and 9, in the acoustic resonator 300, a second electrode 325 is disposed entirely in the center portion S and partially in the extension portion E, and may not be disposed outwardly of the extension portion E.

Thus, an edge of the second electrode 325 disposed in the extension portion E is located on the inclined surface L of the piezoelectric layer 123 or an inclined surface of the upper insertion layer 370b.

As the second electrode 325 is only disposed in the resonant portion 320, the second electrode 125 is spaced apart from the second metal layer 190, so the second electrode 325 is electrically connected to the second metal layer 190 through the upper insertion layer 370b. A protective layer 327 is formed on an upper surface of the upper insertion layer 370b.

Moreover, referring to FIG. 9, the upper insertion layer 370b is spaced apart from a vertical interface R of the center portion S by a predetermined distance w1.

The extension portion E includes a first reflective region (hereinafter, a W1 region), which is a region between the vertical interface R with the center portion S and the upper insertion layer 370b, and a second reflective region (hereinafter, a W2 region) located outwardly of the first reflective region, and defined as a region in which the upper insertion layer 370b and the second electrode 325 are disposed together.

A portion of the second electrode 325 disposed on the upper insertion layer 370b may be disposed in only some regions of the inclined surface L of the upper insertion layer 370b.

In this example, the upper insertion layer 370b is not disposed in the W1 region. However, in the W1 region, the second electrode 325 may rise due to a shape of the upper insertion layer 370b. Thus, since the W1 region has a greater thickness as compared with the center portion S, acoustic impedance of the W1 region is further increased as compared with the center portion S.

Moreover, the W2 region is a region, further including the upper insertion layer 370b, as compared with the w1 region. In the W2 region, the upper insertion layer 370b is inserted between the second electrode 325 and the piezoelectric layer 123. The upper insertion layer 370b is formed of a metal material with lower acoustic impedance, as compared with the piezoelectric layer 123 or the second electrode 325. Thus, the W2 region has lower acoustic impedance as compared with the w1 region.

In this example, as the center portion S, the W1 region, and the W2 region have a sparse/dense/sparse structure, a reflective interface for reflecting a lateral wave to an interior of a resonant portion 320 is increased. Thus, most lateral waves cannot flow outwardly of the resonant portion 320, and are reflected and then flow to an interior of the resonant portion 320, thereby improving attenuation characteristics.

Large attenuation of the acoustic resonator 300 means that loss occurring as a lateral wave flows outwardly of the resonant portion 320 is small. Consequently, a performance of the acoustic resonator 300 is improved.

When W1 and W2 are n/4 times a wavelength (A) of a lateral wave, reflection efficiency is increased. In this regard, in order to increase the reflection efficiency, a width of the W1 region and a width of the W2 region may be adjusted in consideration of a wavelength of a lateral wave.

The configuration illustrated in FIG. 9 is not limited to the described example, and may be applied to other examples.

Figure 10:
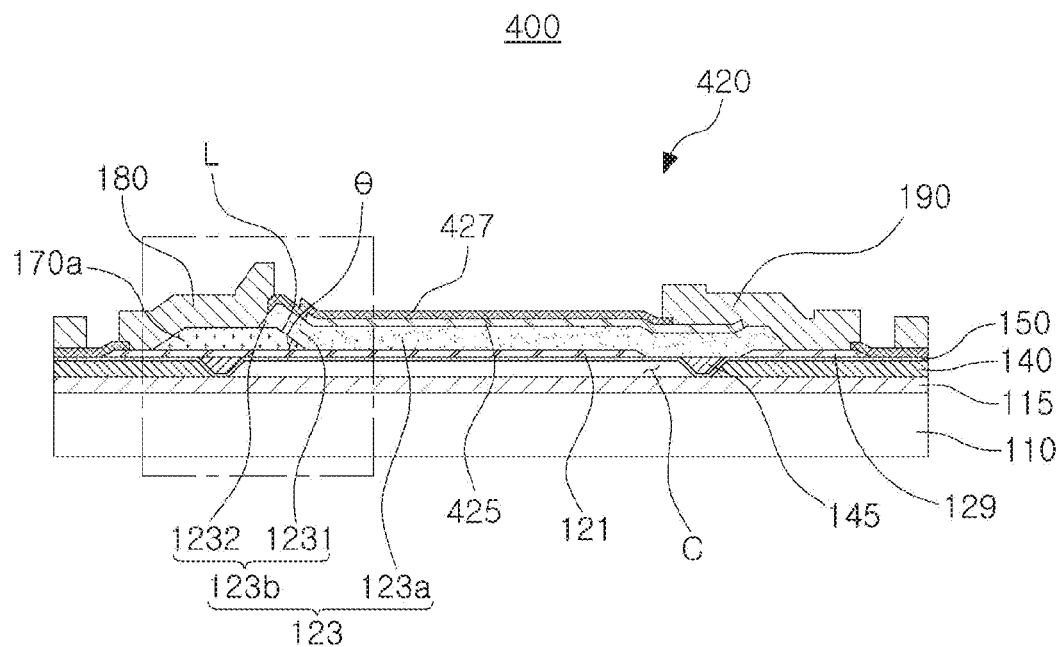
FIG. 10 is a schematic cross-sectional view illustrating an acoustic resonator, according to another example.
Figure 11:
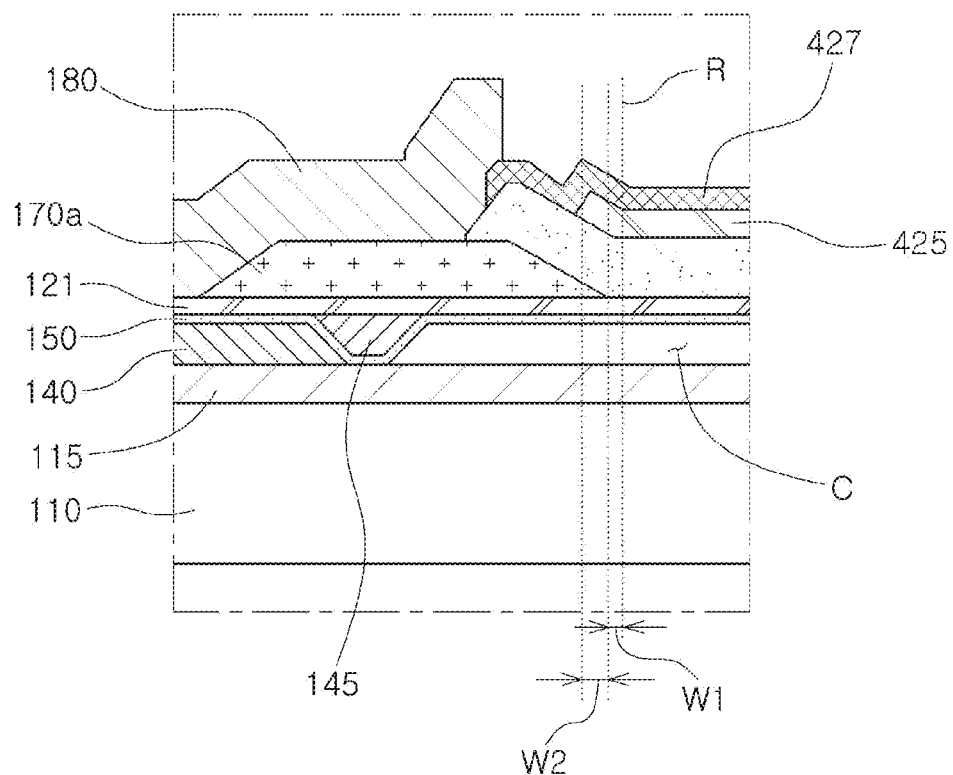
FIG. 11 is an enlarged view of a lower insertion layer of FIG. 10.

FIG. 10 is a schematic cross-sectional view illustrating an acoustic resonator 400, according to another example. FIG. 11 is an enlarged view of the lower insertion layer of FIG. 10.

The acoustic resonator, illustrated in FIG. 10, is only provided with the lower insertion layer 170a. Moreover, as shown in FIG. 11, the lower insertion layer 170a is spaced apart from a vertical interface R of an extension portion E of the center portion S by a predetermined distance W1. In addition, a portion of a second electrode 425 that is disposed on the inclined portion 1231 of the piezoelectric layer 123, is disposed on only a portion of the inclined surface of the inclined portion 1231. A protective layer 427 is formed on an upper surface of the second electrode 425.

Moreover, referring to FIG. 11, in a similar manner to the example of FIGS. 8 and 9 described above, the lower insertion layer 170a is not disposed in the W1 region, but the second electrode 425 rises according to a shape of the lower insertion layer 170a in the W1 region. Thus, since the W1 region has a greater thickness as compared with the center portion S, acoustic impedance of the W1 region is further increased as compared with the center portion S.

Moreover, the W2 region is a region further including the lower insertion layer 170a, as compared with the W1 region. In the W2 region, the lower insertion layer 170b is inserted between the first electrode 121 and the piezoelectric layer 123. As described previously, the upper insertion layer 170b is formed of a metal material with lower acoustic impedance, as compared with the piezoelectric layer 123 or the first electrode 121. Thus, the W2 region has lower acoustic impedance as compared with the W1 region.

In a similar manner to the case of FIG. 9 described above, since the center portion S, the W1 region, and the W2 region have a sparse/dense/sparse structure, a reflective interface for reflecting a lateral wave to an interior of a resonant portion 420 is increased. Thus, most lateral waves could not flow outwardly of the resonant portion 420, and are reflected and then flow to an interior of the resonant portion 420, thereby improving attenuation characteristics.

The configuration of FIG. 11 is not limited to the example described above, and may be applied to other examples.

Figure 12:
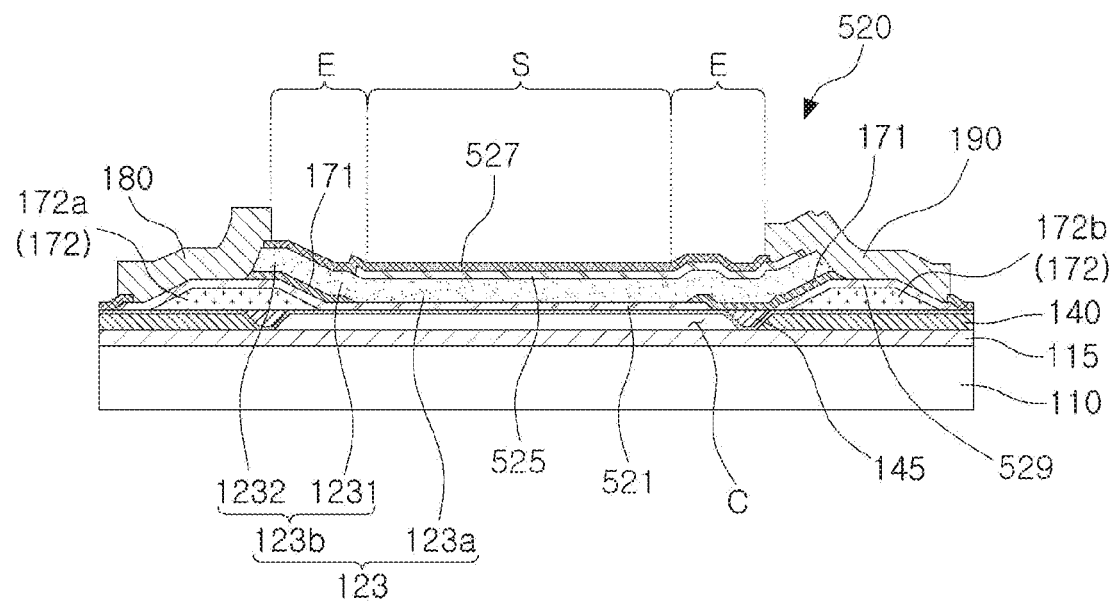
FIG. 12 is a schematic cross-sectional view illustrating an acoustic resonator, according to another example.

FIG. 12 is a schematic cross-sectional view illustrating an acoustic resonator 500, according to another example.

Referring to FIG. 12, the acoustic resonator 500 includes an insulating insertion layer 171 and a lower insertion layer 172.

In the present example, the insulating insertion layer 171 is provided for formation of the extension portion E to have a thickness that is greater than a thickness of the center portion S. Moreover, the lower insertion layer 172 is used to extend an electrical path of a first electrode 521 or a second electrode 525 from a boundary portion (that is, the extension portion E) of the center portion S.

A protective layer 527 is formed on an upper surface of the second electrode 525.

Thus, the insulating insertion layer 171 may be formed of a dielectric such as silicon oxide ($SiO_2$), aluminum nitride (AlN), aluminum oxide ($Al_2O_3$), silicon nitride (SiN), magnesium oxide (MgO), zirconium oxide ($ZrO_2$), lead zirconate titanate (PZT), gallium arsenide (GaAs), hafnium oxide ($HfO_2$), titanium oxide ($TiO_2$), or zinc oxide (ZnO), rather than a conductive material, in order to have small acoustic impedance, but is formed of a material different from that of the piezoelectric layer 123.

The lower insertion layer 172 includes a first insertion layer 172a, disposed below the first electrode 521, and a second insertion layer 172b, disposed below the third electrode 529. Here, the second electrode 525 is not directly connected to the second insertion layer 172b, but is indirectly connected to the second insertion layer 172b through the second metal layer 190 and the third electrode 529. In this regard, the second insertion layer 172b extends an electrical path of a portion in which the second metal layer 190 and the third electrode 529 are connected to each other.

The lower insertion layer 172 may contain a metal material. For example, the lower insertion layer 172 may be formed of gold, molybdenum, ruthenium, iridium, aluminum, platinum, titanium, tungsten, palladium, tantalum, chromium, nickel, or a metal containing any one or any combination of any two or more thereof, but it is not limited thereto.

In the acoustic resonator 500, the lower insertion layer 172 is disposed to be further far away from the center of a resonant portion 520, as compared with the insulating insertion layer 171.

The lower insertion layer 172 may be disposed on an upper surface of the first electrode 521, that is, between the piezoelectric layer 123 and the insulating insertion layer 171.

In the acoustic resonator 500, when a horizontal distance between the insulating insertion layer 171 and the lower insertion layer 172 is adjusted, a reflective performance of a lateral wave, generated at an antiresonance point, may be further improved, thereby additionally improving an attenuation performance.

In the acoustic resonator 500, large attenuation of an acoustic resonator means that loss occurring as a lateral wave flows outwardly of the resonant portion 520 is small. Consequently, it means that a performance of the acoustic resonator is improved.

Figure 13:
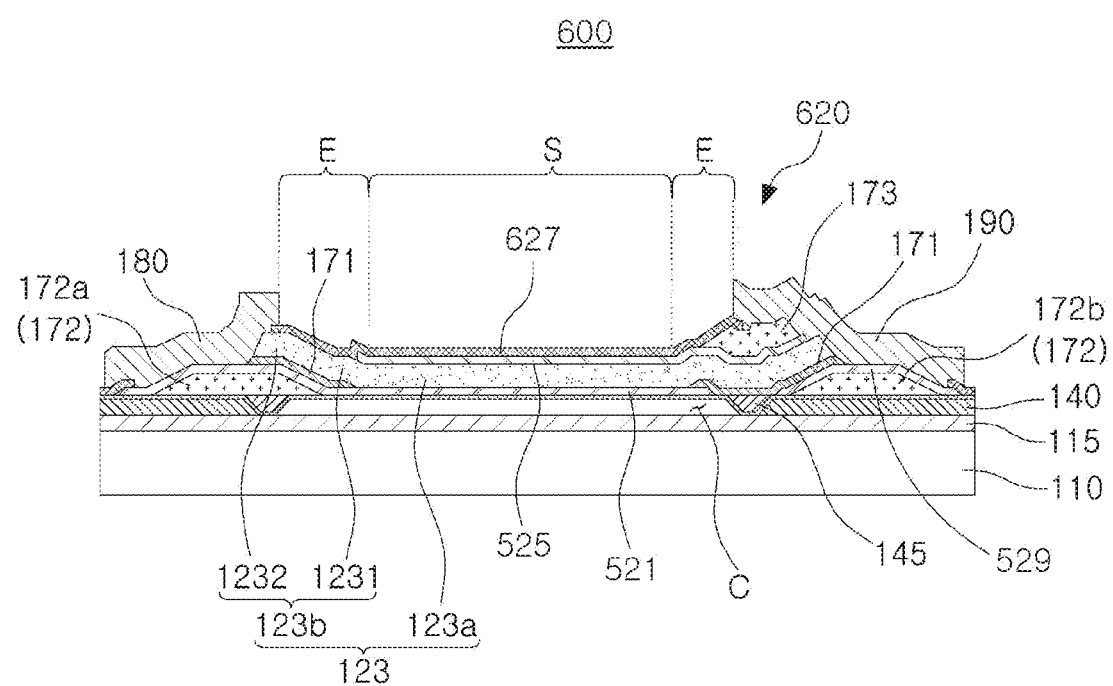
FIG. 13 is a schematic cross-sectional view illustrating an acoustic resonator, according to another example.

FIG. 13 is a schematic cross-sectional view illustrating an acoustic resonator 600, according to another example.

In FIG. 13, as a modified example of FIG. 12, the acoustic resonator 600 includes a resonant portion 620, the insulating insertion layer 171, the lower insertion layer 172, and an upper insertion layer 173.

Since the insulating insertion layer 171 and the lower insertion layer 172 are configured in the same manner as in the example of FIG. 12, a detailed description thereof will be omitted.

The upper insertion layer 173 is stacked on an upper portion or a lower portion of the second electrode 525, thereby extending an electrical path between the second electrode 525 and the second metal layer 190. Thus, in the present example, an electrical path of the second electrode 525 may be extended at two places due to the upper insertion layer 173 and the second insertion layer 172b.

The acoustic resonator 600 may be manufactured by sequentially stacking the lower insertion layer 172, the first electrode 521, the insulating insertion layer 171, the piezoelectric layer 123, the second electrode 525, the upper insertion layer 173, a protective layer 627, and the first metal layer 180, and the second metal layer 190 on the membrane layer 150.

As set forth above, according to embodiments disclosed herein, in an acoustic resonator, an insertion layer is formed of a conductive material and is disposed in a boundary portion of a resonance active area of an acoustic resonator, so an electrical path of a first electrode or a second electrode may be extended in a boundary portion of the resonance active area. Thus, wiring resistance of a first electrode and a second electrode may be lowered, thereby reducing insertion loss of the acoustic resonator.

Moreover, two reflective regions having different acoustic impedance are disposed in an extension portion, thereby increasing reflection efficiency of a lateral wave.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator, comprising:
   a substrate;
   a resonant portion comprising a center portion in which a first electrode, a piezoelectric layer, and a second electrode are sequentially stacked on the substrate, and an extension portion disposed along a periphery of the center portion; and
   a first metal layer disposed outwardly of the resonant portion to be electrically connected to the first electrode,
   wherein the extension portion comprises a lower insertion layer disposed on an upper surface of the first electrode or a lower surface of the first electrode,
   wherein the piezoelectric layer comprises a piezoelectric portion disposed in the center portion, and a bent portion disposed in the extension portion and extended from the piezoelectric portion at an incline according to a shape of the lower insertion layer, and
   wherein the lower insertion layer is formed of a conductive material extending an electrical path between the first electrode and the first metal layer.

2. The acoustic resonator of claim 1, further comprising:
   a second metal layer disposed outwardly of the resonant portion to be electrically connected to the second electrode; and
   an upper insertion layer disposed in the extension portion and disposed on an upper surface or a lower surface of the second electrode, and extending an electrical path between the second electrode and the second metal layer.

3. The acoustic resonator of claim 2, wherein the second electrode is spaced apart from the second metal layer, and is electrically connected to the second metal layer through the upper insertion layer.

4. The acoustic resonator of claim 2, further comprising:
   a third electrode disposed on a same plane as the first electrode and spaced apart from the first electrode,
   wherein the second electrode is electrically connected to the third electrode through the second metal layer.

5. The acoustic resonator of claim 2, wherein the upper insertion layer is spaced apart from a boundary between the center portion and the extension portion, wherein the extension portion further comprises a first reflective region disposed between the boundary and the upper insertion layer, and a second reflective region disposed outwardly of the first reflective region, and wherein the upper insertion layer and the second electrode are disposed together in the second reflective region.

6. The acoustic resonator of claim 1, wherein the lower insertion layer is formed of a material with an acoustic impedance lower than an acoustic impedance of the piezoelectric layer and the first electrode.

7. The acoustic resonator of claim 1, wherein the piezoelectric layer is formed of aluminum nitride (AlN), the first electrode is formed of molybdenum (Mo), and the lower insertion layer is formed of aluminum (Al) or an aluminum (Al) alloy.

8. The acoustic resonator of claim 1, wherein the lower insertion layer is spaced apart from a boundary of the center portion, wherein the extension portion further comprises a first reflective region disposed between the boundary and the lower insertion layer, and a second reflective region disposed outwardly of the first reflective region, and wherein the lower insertion layer and the second electrode are disposed together in the second reflective region.

9. The acoustic resonator of claim 8, wherein the second reflective region has an acoustic impedance lower than an acoustic impedance of the first reflective region.

10. The acoustic resonator of claim 1, further comprising:

an insulating insertion layer disposed between the lower insertion layer and the piezoelectric layer, and causing the bent portion to rise.

11. The acoustic resonator of claim 1, wherein a thickness of the extension portion is greater than a thickness of the center portion.

12. An acoustic resonator, comprising:

a substrate;

a resonant portion comprising a center portion in which a first electrode, a piezoelectric layer, and a second electrode are sequentially stacked on the substrate, and an extension portion disposed along a periphery of the center portion; and a lower insertion layer disposed in the extension portion, and disposed on an upper surface of the first electrode or a lower surface of the first electrode, wherein the lower insertion layer is spaced apart from a boundary between the center portion and the extension portion, and wherein the extension portion comprises a first reflective region disposed between the boundary and the lower insertion layer, and a second reflective region in which the lower insertion layer and the second electrode are disposed together.

13. The acoustic resonator of claim 12, wherein the piezoelectric layer comprises a piezoelectric portion disposed in the center portion, and an inclined portion disposed in the extension portion and extended from the piezoelectric portion at an incline according to a shape of the lower insertion layer, and wherein the first reflective region and the second reflective region are disposed within a range in which the inclined portion is disposed.

14. The acoustic resonator of claim 12, wherein the lower insertion layer is formed of a conductive material.

15. The acoustic resonator of claim 12, wherein an inclination angle of the inclined portion is in a range of 5° to 70°.

16. A method of manufacturing an acoustic resonator, comprising:

forming a resonant portion by
stacking a first electrode, a piezoelectric layer, and a second electrode on a substrate, and forming a lower insertion layer, comprising a conductive material, on an upper surface of the first electrode or a lower surface of the first electrode; and forming a first metal layer on the lower insertion layer, after the forming of the resonant portion.

17. The method of claim 16, wherein the resonant portion includes a center portion in which the first electrode, the piezoelectric layer, and the second electrode are sequentially stacked on the substrate, and an extension portion disposed along a periphery of the center portion, and wherein the lower insertion layer is disposed in the extension portion and spaced apart from a boundary between the center portion and the extension portion by a distance.

18. The method of claim 17, wherein the extension portion comprises a first reflective region disposed between the boundary and the lower insertion layer, and a second reflective region disposed outwardly of the first reflective region, and in which the lower insertion layer and the second electrode are disposed together.

* * * * *